(12) United States Patent
Kim

(10) Patent No.: US 7,940,597 B2
(45) Date of Patent: May 10, 2011

(54) SEMICONDUCTOR MEMORY DEVICE AND PARALLEL TEST METHOD OF THE SAME

(75) Inventor: Bo-Yeun Kim, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 300 days.

(21) Appl. No.: 12/134,780

(22) Filed: Jun. 6, 2008

(65) Prior Publication Data

US 2009/0219774 A1    Sep. 3, 2009

(30) Foreign Application Priority Data

Mar. 3, 2008 (KR) .......................... 10-2008-0019681

(51) Int. Cl.
*G11C 8/00* (2006.01)
(52) U.S. Cl. .............. 365/230.03; 365/201; 365/189.02; 365/189.03; 365/189.15; 365/189.16; 365/189.17; 365/189.19; 365/220; 365/230.02; 365/233.5
(58) Field of Classification Search .................. 365/201, 365/230.03, 189.02, 189.03, 189.15, 189.16, 365/189.17, 189.19, 220, 230.02, 233.5
See application file for complete search history.

(56) References Cited

U.S. PATENT DOCUMENTS 7,706,199 B2 * 4/2010 Ku et al. ........................ 365/201

FOREIGN PATENT DOCUMENTS

| JP | 10-172283 | * | 6/1998 |
| KR | 10-0576454 | * | 9/2005 |
| KR | 10-0576454 | | 4/2006 |
| KR | 1020070080044 | * | 8/2007 |
| KR | 1020070080044 A | | 8/2007 |

OTHER PUBLICATIONS

Notice of Preliminary Rejection issued from Korean Intellectual Property Office on Jul. 15, 2009 with an English Translation.

* cited by examiner

*Primary Examiner* — Hoai V Ho
*Assistant Examiner* — Fernando N Hidalgo
(74) *Attorney, Agent, or Firm* — IP & T Group LLP

(57) ABSTRACT

Semiconductor memory device and parallel test method of the same. The test includes writing data into multiple memory banks simultaneously, reading the data from a portion of the memory banks, compressing the read data and outputting the compressed data to the outside of a chip.

18 Claims, 3 Drawing Sheets

SEMICONDUCTOR MEMORY DEVICE AND PARALLEL TEST METHOD OF THE SAME

CROSS-REFERENCE TO RELATED APPLICATIONS

The present invention claims priority of Korean patent application number 10-2008-0019681, filed on Mar. 3, 2008, which is incorporated by reference in its entirety.

BACKGROUND OF THE INVENTION

The present invention relates to a semiconductor memory device, and more particularly, to a technique for reducing a fabrication cost by shortening a test time of a parallel test of a semiconductor memory device.

Development of a process technology is leading to high integration of a semiconductor memory device. To ensure chip reliability, the semiconductor memory device is tested with expensive test equipment over a long period of time after its fabrication.

In a device test technique, it is important to achieve a high-speed of a test performed on tens of millions of cells, as well as reliability of the test. Particularly, since a fabrication cost is directly affected by a development time of a semiconductor memory device and a test time until product release, shortening the test time is considered very important in fabrication efficiency and competition between manufacturers.

In general, a cell-by-cell test increases the cost and test time in determining a cell pass/fail of a memory chip for a highly integrated semiconductor memory device.

Therefore, a parallel test mode is used to reduce the test time.

In a parallel test, identical data are written into a plurality of cells, and then an exclusive OR logic gate is used for a read operation to determine a pass with '1' when the identical data are read from the plurality of cells, and determine a fail with '0' when different data are read even from one cell. Accordingly, the test time can be reduced.

FIG. 1 illustrates a process of a conventional parallel test performed on a semiconductor memory device having eight memory banks by using four data pins. In this drawing, as well as in FIG. 2, ACT=activate, WT=write, RD=read and PCG=pre-charge.

In a write operation of the conventional parallel test, banks 0 to 3 are simultaneously activated, and identical data are simultaneously written into the activated banks 0 to 3. Thereafter, banks 4 to 7 are simultaneously activated, and identical data are also written into the banks 4 to 7, simultaneously.

Like the write operation, in a read operation of the conventional parallel test, the banks 0 to 3 are simultaneously activated, and the data are simultaneously read out from the activated banks 0 to 3 and compressed. Then, a result of pass/fail is output to a data pin (DQ). Thereafter, the banks 4 to 7 are simultaneously activated, and the data are simultaneously read out from the activated banks 4 to 7 and compressed. Then, a result of pass/fail is output to a data pin (DQ).

In the general parallel test, when N banks are simultaneously tested, data of the respective banks are simultaneously output, and compressed results are output using N data pins (DQ) representing the N banks, respectively. For example, a result of data compression of the bank 0 is output to a data pin 0 (DQ0), and a result of data compression of the bank 1 is output to a data pin 1 (DQ1).

Thus, if the parallel test is performed on a memory device having eight memory banks with only four data channels allocated from test equipment, the banks are divided into halves and a write/read operation is performed twice as shown in FIG. 1. Since all the banks are not simultaneously tested and the write/read operation is performed twice, the test time of the memory device increases.

Of course, the read/write operation may be performed simultaneously on all the banks by allocating eight data channels from the test equipment. However, as more data channels are allocated from the test equipment, the test equipment simultaneously tests less chips. This also increases the test time.

Alternatively, a method of increasing a compression ratio may be employed in the parallel test. For example, by increasing the compression ratio, data of the banks 0 and 1 may be compressed together and output to the data pin 0 (DQ0), and data of the banks 2 and 3 may be compressed together and output to the data pin 1 (DQ1). If this method is used, the parallel test can be simultaneously performed on the eight banks with only four data channels allocated. However, the increased compression ratio in the parallel test degrades efficiency of Y repair.

This is because in the case where the data of the banks 0 and 1 are compressed together and output to the data pin 0 (DQ0), both banks 0 and 1 must be examined to find a defective data cell when a signal indicating a 'fail' is output to the data pin 0 (DQ0), whereas in the case where data of only the bank 0 is compressed and output to the data pin 0 (DQ0), only the bank 0 is examined to find a defective data cell.

Also, since the test equipment is limited in applicable amount of current, a defective operation may be caused because of a voltage drop, which is a phenomenon where a voltage supplied from the test equipment drops, if the write/read operation is performed simultaneously on all the banks of the memory device.

SUMMARY OF THE INVENTION

Embodiments of the present invention are directed to providing a semiconductor memory device and a parallel test method of the same, which can achieve a quick test without degradation of Y repair efficiency, by controlling the number of memory banks being simultaneously written and read in a parallel test of the semiconductor memory device.

In accordance with an aspect of the invention, there is provided a writing data into a plurality of memory banks simultaneously, reading the data from a portion of the plurality of memory banks and compressing the read data and outputting the compressed data to the outside of a chip.

DESCRIPTION OF SPECIFIC EMBODIMENTS

Hereinafter, a semiconductor memory device and a parallel test method of the same in accordance with the present invention will be described in detail with reference to the accompanying drawings.

Figure 1:
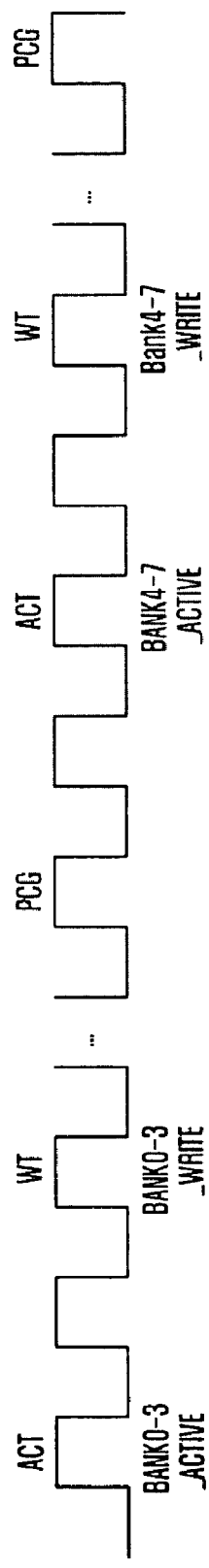
FIG. 1 illustrates a process of a conventional test process performed on a memory device having eight memory banks by using four data pins.
Figure 1:
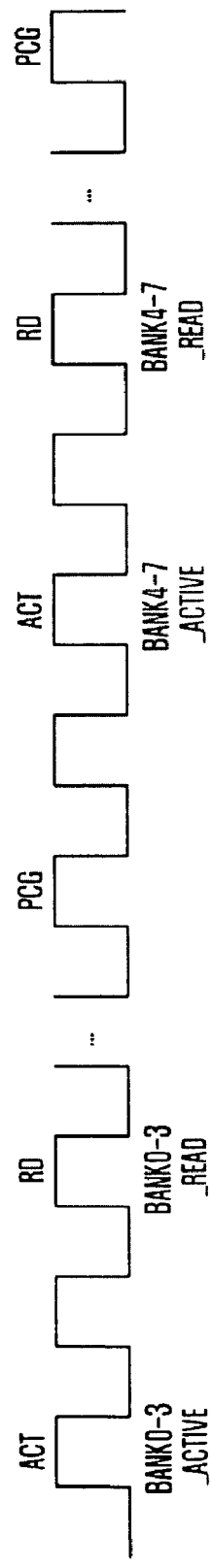
Figure 2:
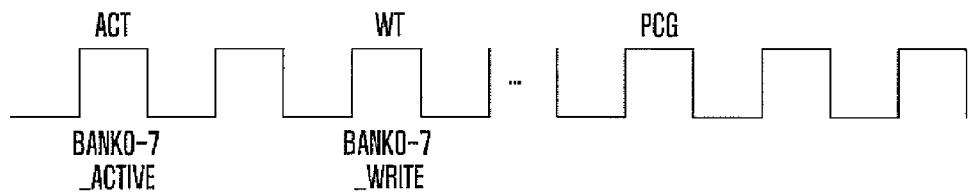
FIG. 2 is a view for explaining a parallel test method of a semiconductor memory device in accordance with an embodiment of the present invention.
Figure 2:
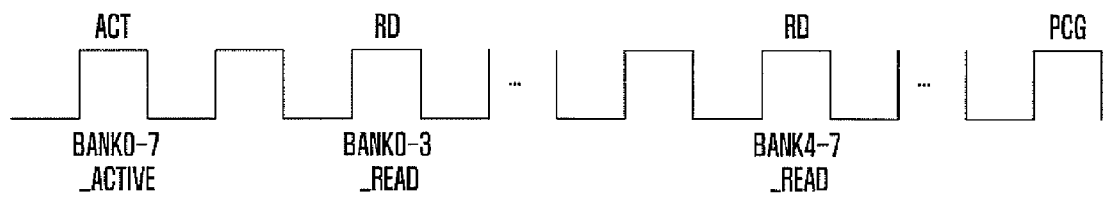

FIG. 2 is a view for explaining a parallel test method of a semiconductor memory device in accordance with an embodiment of the invention.

The parallel test method in accordance with the embodiment of the invention includes a write operation BANK0-7_WRITE of writing data into a plurality of memory banks, i.e., banks 0 to 7; a read operation BANK0-3_READ or BANK4-7_READ of reading the data from a portion of the plurality of memory banks, i.e., the banks 0 to 3 or the banks 4 to 7; and an operation of compressing the read data and outputting the compressed data to the outside of a chip.

First, data are written into the plurality of banks, i.e., the banks 0 to 7. Although eight banks of the banks 0 to 7 are operated simultaneously in the drawing, the number of banks operated simultaneously may be varied. For example, if a memory device has only four banks, the four banks may be operated simultaneously, and if the memory device has sixteen banks, the write operation may be simultaneously performed on all the sixteen banks or on eight out of the sixteen banks. In general, current semiconductor memory devices each have eight banks. In this case, the write operation may be performed simultaneously on the eight banks for a quick test. That is, in due consideration of the test time, the write operation may be performed simultaneously on as many banks as possible. The term 'simultaneously' does not mean that the write operation is performed on the eight banks at exactly the same time, but means that the write operation is performed on the eight banks together. This is because even if the write operation is intended to be performed on the eight banks at exactly the same time, it may be performed with a slight time difference because of physical location differences between the banks.

Then, the read operation of reading data is performed. In accordance with the embodiment of the invention, the read operation is performed on a smaller number of banks than those in the write operation. While the write operation is performed simultaneously on the plurality of banks, the read operation is performed a plurality of times on portions of the plurality of banks. For example, if the write operation is performed on the eight banks, the read operation is performed on each four banks. That is, the read operation is performed separately on the banks 0 to 3 and the banks 4 to 7. The read operation in the parallel test is performed a greater number of times than those of the write operation. The number of times of performing the read operation may be reduced by simultaneously performing the read operation on the eight banks. However, in this case, the compression ratio in the parallel test must be increased, degrading the Y repair efficiency. Also, if the read operation is simultaneously performed on many banks like the write operation, the amount of current required by the memory device significantly increases, and thus overload of test equipment may occur. For this reason, the number of banks operated simultaneously in the read operation is smaller than the number of banks operated simultaneously in the write operation.

The data read out from the banks are compressed and output to the outside of a chip. In general, a result of data compression output from one bank is output to one data pin (DQ). That is, the number of data pins (DQs) being used is equal to the number of banks from which data are read in the read operation. In the case where the read operation is performed on each four banks, in a read operation of the banks 0 to 3, a data compression result of the bank 0 is output to a data pin 0 (DQ0), a data compression result of the bank 1 is output to a data pin 1 (DQ1), a data compression result of the bank 2 is output to a data pin 2 (DQ2), and a data compression result of the bank 3 is output to a data pin 3 (DQ3). Likewise, in the read operation of the banks 4 to 7, a data compression result of the bank 4 is output to a data pin 4 (DQ4), a data compression result of the bank 5 is output to a data pin 5 (DQ5), a data compression result of the bank 6 is output to a data pin 6 (DQ6), and a data compression result of the bank 7 is output to a data pin 7 (DQ7).

A bank select signal may be allocated so as to determine whether to operate the banks 0 to 3 or the banks 4 to 7 in the read operation according to a logic level of the bank select signal.

The overall operation will now be described on the assumption that a memory device has eight banks, i.e., the banks 0 to 7, and a parallel test is performed using four data pins, i.e., channels.

First, identical data are input to four data pins (DQ0 to DQ3) and written into the eight banks simultaneously. In a write operation of a parallel test, identical data are written. Thus, even if just four data pins (DQ0 to DQ3) are used, there is no difficulty in inputting data to be written into the eight banks. Also, in the write operation, the identical data may be written into all the banks using only one data pin (e.g., only DQ0). This can be achieved by slightingly adjusting a multiplexing technique of a data input/output line (GIO line), which is obvious to those skilled in the art.

Thereafter, a read operation is performed. The read operation of the data is performed for each four banks. First, the data are read out from the banks 0 to 3. The data read out from the banks 0 to 3 are compressed bank by bank, and results of such compression are output to the respective data pins. That is, the data compression results of the banks 0 to 3 are respectively output to the data pins 0 to 3 (DQ0 to DQ3), and data compression results of the banks 4 to 7 are respectively output to the data pins 4 to 7 (DQ4 to DQ7).

In the conventional parallel test, to test a memory device having eight banks, data are simultaneously written/read into/from the eight banks by using eight data pins (DQ0 to DQ7). Alternatively, in the conventional parallel test, four data pins (DQ0 to DQ3) may be used, and the write operation is performed on each four banks, i.e., twice, and the read operation is also performed on each four banks, i.e., twice. That is, the number of banks operated simultaneously is the same in the write and read operations. However, in accordance with the embodiment of the invention, the time for the write operation is reduced because the eight banks are simultaneously operated in the write operation, and the Y repair efficiency is improved by performing the read operation on each four banks. If the read operation is performed simultaneously on all the eight banks and the data read from the eight banks are compressed and output to only four data pins, it becomes difficult to determine a bank where a fail occurs when the fail is detected, and thus the repair efficiency is degraded.

Only the write and read operations of the banks have been described above in the parallel test in accordance with the embodiment of the invention. The following description will be made, including an active operation. In the case where the concept of the active operation performed before the write and read operations is included, a parallel test method of a semiconductor memory device in accordance with an embodiment of the invention includes: an active operation BANK0-7_ACTIVE of activating a plurality of memory banks, i.e., banks 0 to 7; a write operation BANK0-7_WRITE of writing data into the plurality of memory banks, i.e., the banks 0 to 7; an active operation BANK0-7_ACTIVE of activating the plurality of memory banks, i.e., the banks 0 to 7; a read operation BANK0-3_READ or BANK4-7_READ of reading data from a portion of the plurality of memory banks, i.e., the banks 0 to 3 or the banks 4 to 7; and an operation of compressing the read data and outputting the compressed data to the outside of a chip.

The write operation, the read operation, and the output operation have already been described above, and further description thereof will be omitted.

The active operation before the write operation is performed on all the banks undergoing the write operation. This is obvious because the write operation cannot be performed without the active operation. Thus, if the write operation is performed on the eight banks, i.e., the banks 0 to 7, all the banks 0 to 7 are activated before the write operation.

The active operation before the read operation is performed simultaneously on all the memory banks, i.e., the banks 0 to 7 having undergone the write operation. In the case of the eight banks, the read operation is performed on the banks 0 to 3 first, and then on the banks 4 to 7, but the active operation is performed simultaneously on all the eight banks, the banks 0 to 7. Of course, operations may be performed in the order of a bank 0-3 active operation, a bank 0-3 read operation, a bank 4-7 active operation and a bank 4-7 read operation. However, this may delay the test time because the active operation is performed twice. Accordingly, it is more advantageous to perform the active operation simultaneously on the eight banks, i.e., the banks 0 to 7, and then perform the read operation on each four banks.

In the conventional parallel test performed on the eight banks, operations are performed in the order of a bank 0-3 active (BANK0-3_ACTIVE) operation, a bank 0-3 write (BANK0-3_WRITE) operation, a bank 4-7 active (BANK4-7_ACTIVE) operation, a bank 4-7 write (BANK4-7_WRITE) operation, a bank 0-3 active operation, a bank 0-3 read operation, a bank 4-7 active operation and a bank 4-7 read operation. However, in the parallel test method in accordance with the embodiment of the invention, operations are performed in the order of a bank 0-7 active operation, a bank 0-7 write operation, a bank 0-7 active operation, a bank 0-3 read operation and a bank 4-7 read operation. Accordingly, the operations are remarkably reduced as compared to the conventional parallel test method, and thus the time for the parallel test can be reduced. Also, since the read operation is performed for each four banks, i.e., the banks 0 to 3 or the banks 4 to 7, the Y repair efficiency can be maintained at the same level as in the conventional parallel test.

The activation of all the banks in the parallel test can be achieved by activating them regardless of bank addresses. Those skilled in the art can easily design all the banks to be activated in the parallel test. Although all the banks are simultaneously activated in the parallel test in the embodiment of the invention, the invention is not limited thereto, and banks that are to undergo the write or read operation may be activated as in the conventional parallel test. For example, eight banks to undergo the write operation may be activated before the write operation, and the active operation before the read operation may be performed on each four banks, i.e., twice. However, to complete the parallel test within a short period of time, the eight banks may be activated simultaneously even for the read operation.

In accordance with the embodiment of the invention, the number of banks simultaneously undergoing the write operation is different from the number banks simultaneously undergoing the read operation, so that the time for the parallel test can be reduced. Those skilled in the art can easily change the design of the memory device or control of the test equipment in order to perform the parallel test in the above-mentioned manner.

Figure 3:
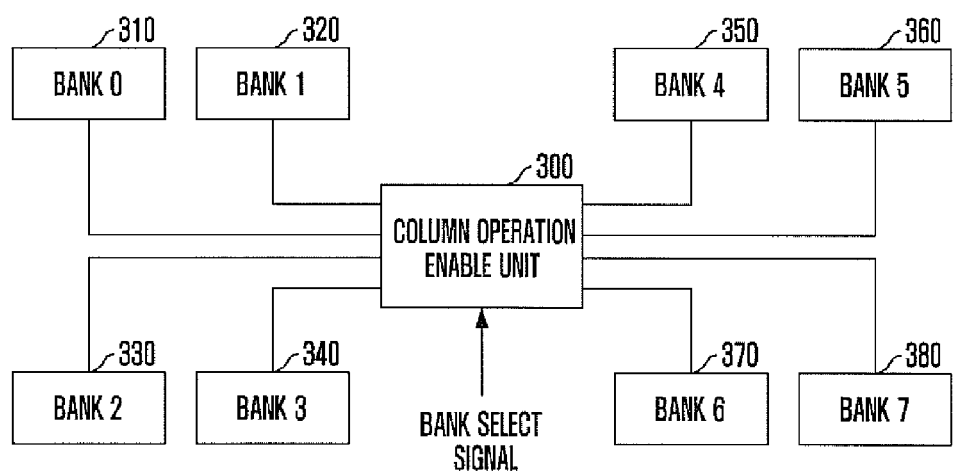
FIG. 3 is a block diagram of a semiconductor memory device performing a parallel test by the parallel test method of FIG. 2, in accordance with an embodiment of the invention.

FIG. 3 is a block diagram of a semiconductor memory device performing a parallel test as illustrated in FIG. 2, in accordance with an embodiment of the invention.

The semiconductor memory device in accordance with the current embodiment of the invention includes a plurality of memory banks 310 to 380, i.e., banks 0 to 7 for storing data; and a column operation enable unit 300. In a parallel test mode, the column operation enable unit 300 discerns a write command and a read command, and enables a column operation of a predetermined number of memory banks 310 to 380 when the write command is input. Also, when the read command is input, the column operation enable unit 300 enables the column operation of a portion of the predetermined number of memory banks, i.e., the banks 0 to 3 310 to 340 or the banks 4 to 7 350 to 380 according to a bank select signal.

As is well known, the plurality of memory banks 310 to 380 each store data.

The column operation enable unit 300 discerns a write command and a read command in the parallel test mode, and controls the number of banks 310 to 380 where the column operation is enabled. The column operation refers to a read operation and a write operation. A column select signal (YI) for enabling an input/output sense amplifier (IOSA) must be transmitted to each bank for the column operation, regardless of whether the column operation is the read operation or the write operation. The column operation enable unit 300 may control whether to enable the column operation of each of the banks 310 to 380 by activating or deactivating a signal for activating the column select signal (YI) of each bank or its source signal.

When a write command is input in the parallel test mode, the column operation enable unit 300 enables the column operation of a predetermined number of banks 310 to 380 to perform a write operation. The predetermined number may be varied according to the number of banks of a memory device. The predetermined number is equal to the number of banks simultaneously undergoing the write operation in the above-described parallel test method in accordance with the embodiment of FIG. 2. For example, the predetermined number may be eight in the case of a semiconductor memory device having eight banks 310 to 380 as shown in the drawing.

When a read command is input in the parallel test mode, the column operation enable unit 300 enables the column operation of a portion of the predetermined number of memory banks 310 to 380, i.e., the banks 0 to 3 310 to 340 or the banks 4 to 7 350 to 380. The 'portion of the memory banks' refers to the number of banks simultaneously undergoing the read operation by the above-described parallel test method in accordance with the embodiment of FIG. 2. For example, in the case of the semiconductor memory device having the eight banks 0 to 7 310 to 380, the portion of the predetermined number of memory banks means the banks 0 to 3 310 to 340 or the banks 4 to 7 350 to 380.

If the write operation in the parallel test is performed simultaneously on the banks 0 to 7 310 to 380, the read operation in the parallel test is performed simultaneously on the banks 0 to 3 310 to 340, or on the banks 4 to 7 350 to 380. A bank select signal is required in order to discern the read operation on the banks 0 to 3 310 to 340 from the read operation on the banks 4 to 7 350 to 380. The bank select signal may be received from the outside of a chip or may be internally generated. The bank select signal is one that determines a bank on which the read operation is to be performed, and whether to enable the banks 0 to 3 310 to 340 or the banks 4 to 7 350 to 380 is determined according to whether the bank selection signal is activated or not. For example, if a read command is input when the bank select signal is deactivated, the column operation, i.e., the read operation, of the banks 0 to 3 310 to 340 is enabled. If the read command is input when the bank select signal is activated, the column operation of the banks 4 to 7 350 to 380 is enabled.

Figure 4:
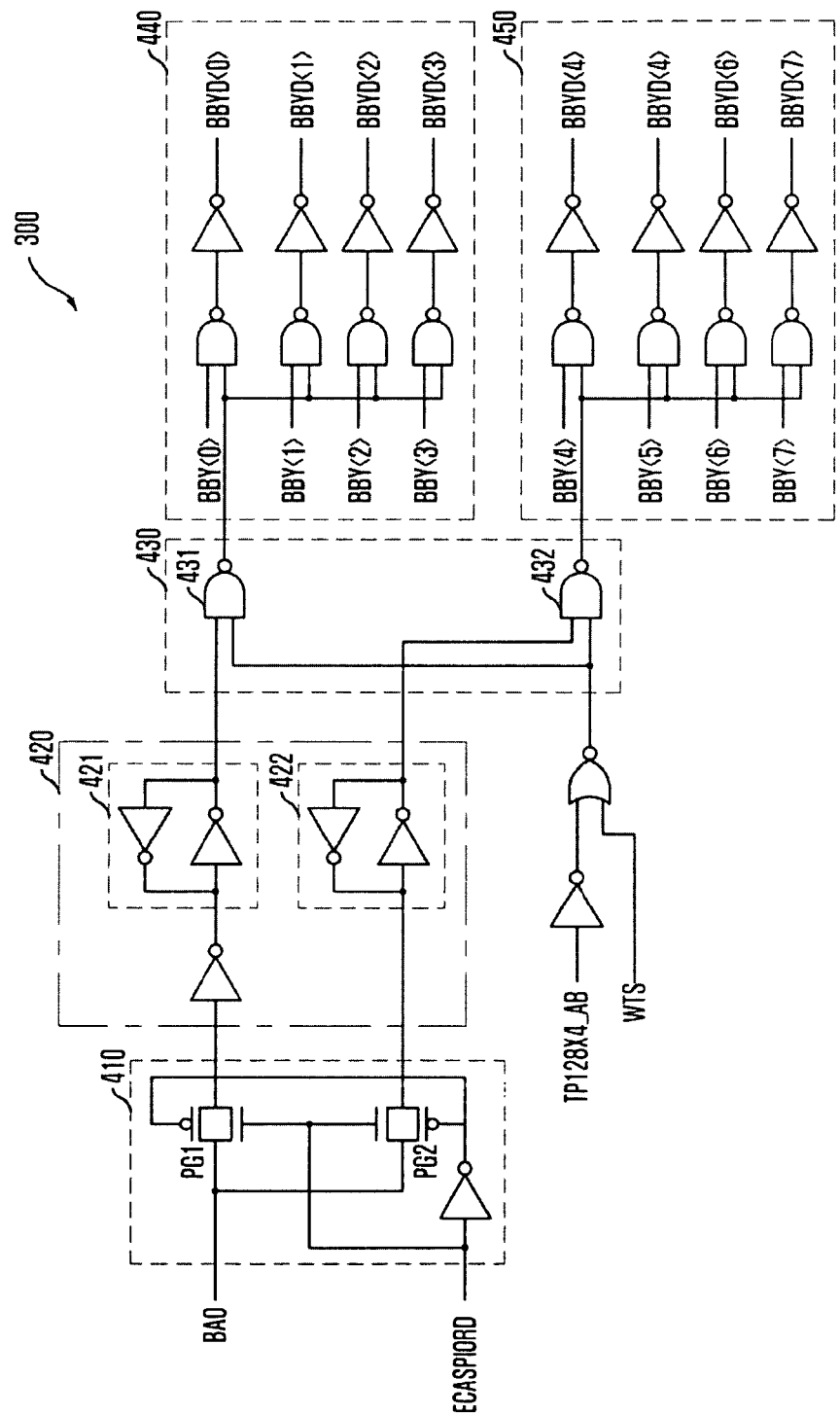
FIG. 4 is circuit diagram illustrating a detailed configuration of a column operation enable unit of FIG. 3 in accordance with an embodiment of the invention.

FIG. 4 is a circuit diagram illustrating a detailed configuration of the column operation enable unit 300 of FIG. 3.

The column operation enable unit 300 includes a first enable part 440 for enabling a column operation of a portion of the banks 310 to 380, i.e., the banks 0 to 3 310 to 340, and a second enable part 450 for enabling the other portion of the banks 310 to 380, i.e., the banks 4 to 7 350 to 380. The first enable part 440 and the second enable part 450 operate together in the write operation of the parallel test, but in the read operation of the parallel test, only one of the first enable part 440 and the second enable part 450 operates according a logic level of a bank select signal BAO.

To control the first enable part 440 and the second enable part 450, the semiconductor memory device further includes an input part 410 for receiving a bank select signal in each read operation, a latch part 420 for latching the input bank select signal BAO, and a control part 430 for enabling an operation of the first enable part 440 or the second enable part 450 in response to the bank select signal BAO in the read operation of the parallel test.

The input part 410 receives a bank select signal BAO in each read operation. The input part 410 opens pass gates PG1 and PG2 in response to an ECASP10RD signal, which is a pulse signal activated whenever a read command is input. In accordance with the embodiment of the invention, it is a required operation in the read operation to select the banks 0 to 3 310 to 340 or the banks 4 to 7 350 to 380 to be enabled according to the bank select signal BAO, and this is not associated with the write operation. In the write operation, all the banks 0 to 7 310 to 380 are enabled regardless of the bank select signal BAO. The bank select signal is a signal for selecting the banks 0 to 3 310 to 340 or the banks 4 to 7 350 to 380 to be enabled in the read operation. Various signals such as a signal received from the outside of a chip and a new test mode signal may be used as the bank select signal. In the current embodiment, a BAO signal that is one of bank addresses is used as the bank select signal. A delay circuit (not shown) may be used at a front end of the input part 410 in order to tune a delay of the bank select signal BAO and the ECAPIORD signal.

The latch part 420 latches the bank select signal BAO input through the input part 410. The latch part 420 includes a first latch 421 and a second latch 422. The first latch 421 latches the bank select signal BAO, and the second latch 422 latches an inverted bank select signal.

In the read operation of the parallel test, the control part 430 enables an operation of the first enable part 440 or the second enable part 450 in response to the bank select signal BAO. A TP128×4_AB signal is activated to a logic high level in a parallel test, and a WTS signal is activated to a logic high level in a write operation. When the TP128×4_AB signal is the logic high level and the WTS signal is the logic low level, a signal of a logic high level is input to NAND gates 431 and 432 of the control part 430. That is, a signal of a logic high level is input to the NAND gates 431 and 432 only in the read operation of the parallel test, otherwise a signal of a logic low level is input to the NAND gates 431 and 432.

If the bank select signal BAO is activated to a logic high level in the read operation of the parallel test, an output of the NAND gate 431 becomes a logic low level, and an output of the NAND gate 432 becomes a logic high level. Thus, the first enable part 440 cannot activate its output signals BBYD<0: 3> to a logic high level, and the second enable part 450 can activate its output signals BBYD<4:7> to a logic high level. That is, the first enable part 440 cannot enable the column operation of the banks 0 to 3 310 to 340, and the second enable part 450 can enable the column operation of the banks 4 to 7 350 to 380.

If the bank select signal BAO is deactivated to a logic low level in the read operation of the parallel test, an output of the NAND gate 431 becomes a logic high level, and an output of the NAND gate 432 becomes a logic low level. Thus, the first enable part 440 can activate its output signals BBYD<0:3> to a logic high level, but the second enable part 450 cannot activate its output signals BBYD<4:7> to a logic high level. That is, an operation of only one of the first enable part 440 and the second enable part 450 is enabled according to whether the bank select signal BAO is the logic high level or the logic low level.

The first enable part 440 enables the column operation of the banks 0 to 3 310 to 340. BBY<0:3> signals input to the first enable part 440 are signals for enabling the column operation of the corresponding banks 0 to 3 310 to 340 when a column address strobe (CAS) command is input. The BBY<0:3> signals are activated according to a bank address in a column operation of a normal operation mode, but all the BBY<0:3> signals are activated in a column operation of the parallel test. If the bank select signal BAO is activated to a logic low level in the write or read operation of the parallel test, all the output signals BBYD<0:3> of the first enable part 440 are activated. Thus, the column operation of each of the banks 0 to 3 310 to 340 is enabled. The BBYD<0:3> signals are source signals that are transmitted to each of the banks 0 to 3 310 to 340 and generate a column select signal (YI) of each of the banks 0 to 3 310 to 340. The column operation of each of the banks 310 to 340 can be performed only when the BBYD<0:3> signals are activated.

If the bank select signal BAO is activated to a logic high level in the read operation of the parallel test, a signal of a logic low level is output from the NAND gate 431. Thus, the first enable part 440 cannot activate the BBYD<0:3> signals. Accordingly, the read operation of the banks 310 to 340 is not enabled.

That is, in the parallel test, the first enable part 440 enables the column operation of all the banks 0 to 3 310 to 340 in the write operation. However, in the read operation, the first enable part 440 enables the column operation of the banks 0 to 3 310 to 340 only when the bank select signal BAO is a logic low level, and does not enable the column operation of the banks 0 to 3 310 to 340 when the bank select signal BAO is a logic high level.

The second enable part 450 enables the column operation of the banks 4 to 7 350 to 380 using signals BBY<4-7>. Since the second enable part 450 is operated basically in the same manner as the first enable part 440, only a result of the operation thereof will be described. Like the first enable part 440, the second enable part 450 enables the column operation of all the banks 4 to 7 350 to 380 in the write operation of the parallel test. However, in the read operation of the parallel test, the second enable part 450 enables the column operation of the banks 4 to 7 350 to 380 when the bank select signal BAO is a logic high level, and does not enable the column operation of the banks 4 to 7 350 to 380 when the bank select signal BAO is a logic low level.

As described above, the first enable part 440 and the second enable part 450 operate together to enable all the banks 0 to 7 310 to 380 in the write operation of the parallel test. However, in the read operation, only one of the first enable part 440 and the second enable part 450 operates according to a logic level of the bank select signal BA0, and thus only the banks 0 to 3 310 to 340 or only the banks 4-7 350 to 380 are enabled.

Thus, by using the column operation enable unit 300 operating as described above, the parallel test can be performed in the same manner as described with reference to FIG. 2.

In accordance with the embodiments of the invention, in the parallel test, data are simultaneously written into a plurality of banks, possibly all, and the data are simultaneously read from a smaller number of banks than those in the write operation.

In the write operation of the parallel test, the banks are simultaneously operated as many as possible, so that time for the write operation can be reduced. In the read operation of the parallel test, data are simultaneously read from a smaller number of banks than those write operation, so that degradation of the Y repair efficiency does not occur.

While the invention has been described with respect to the specific embodiments, it will be apparent to those skilled in the art that various changes and modifications may be made without departing from the spirit and scope of the invention as defined in the following claims.

What is claimed is:

1. A parallel test method of a semiconductor memory device, the method comprising:
   writing data into a plurality of memory banks simultaneously;
   reading the written data from a first portion among the plurality of memory banks;
   reading the written data from a second portion among the plurality of memory banks;
   compressing the read data from the first portion among the plurality of memory banks under a first condition;
   compressing the read data from the second portion among the plurality of memory banks under a second condition; and
   outputting the compressed data from the first and second portions to outside of a chip.

2. The parallel test method as recited in claim 1, wherein the reading of the data is performed a greater number of times than a number of times of the writing of the data to read out all the data written in the writing of the data.

3. The parallel test method as recited in claim 1, wherein the outputting of the compressed data uses a number of data pins equal to the number of the plurality of memory banks from which the data are read in the reading of the data.

4. A parallel test method of a semiconductor memory device, the method comprising:
   activating a plurality of memory banks simultaneously;
   writing data into the plurality of memory banks simultaneously;
   activating the plurality of memory banks simultaneously;
   reading the written data from a first portion of the plurality of memory banks being simultaneously written;
   reading the written data from a second portion of the plurality of memory banks being simultaneously written;
   compressing the read data from the first portion among the plurality of memory banks under a first condition;
   compressing the read data from the second portion among the plurality of memory banks under a second condition; and
   outputting the compressed data from the first and second portions to outside of a chip.

5. The parallel test method as recited in claim 4, wherein the reading of the data is performed a greater number of times than a number of times of the writing of the data to read all the data written in the writing of the data.

6. The parallel test method as recited in claim 5, wherein the outputting of the compressed data uses a number of data pins equal to the number of the plurality of memory banks from which the data are read in the reading of the data.

7. The parallel test method as recited in claim 4, wherein the activating of the plurality of memory banks and the writing the data are performed on all the memory banks, and the reading of the data is performed on half of all the memory banks.

8. The parallel test method as recited in claim 4, wherein the reading of the data comprises selecting the number of the plurality of memory banks according to a logic level of a bank select signal.

9. A semiconductor memory device comprising:
   a plurality of memory banks configured to store data; and
   a column operation enable unit configured to discern a write command and a read command in a parallel test mode, enable a column operation of a predetermined number of memory banks when the write command is received, enable a column operation of a first portion of the predetermined number of memory banks in response to a first condition of a bank select signal when the read command is received, and enable a column operation of a second portion of the predetermined number of memory banks in response to a second condition of the bank select signal when the read command is received.

10. The semiconductor memory device as recited in claim 9, wherein the column operation is enabled by activating a column select signal of a corresponding bank.

11. A semiconductor memory device, comprising:
   a plurality of memory banks configured to store data;
   a first enable part configured to enable a column operation of a first portion of the plurality of memory banks; and
   a second enable part configured to enable a column operation of a second portion of the plurality of memory banks,
   wherein the first enable part and the second enable part are configured to operate together in a write operation of a parallel test, the first enable part is configured to operate according to a first logic level of a bank select signal in a read operation of the parallel test, and the second enable part is configured to operate according to a second logic level of the bank select signal in a read operation of the parallel test.

12. The semiconductor memory device as recited in claim 11, wherein the first enable part is configured to activate a column select signal of the memory banks that the first enable part controls, and to enable the column operation of the memory banks, and the second enable part is configured to activate a column select signal of the memory banks that the second enable part controls, and to enable the column operation of the memory banks.

13. The semiconductor memory device as recited in claim 11, wherein the semiconductor memory device further includes:
   an input part configured to receive the bank select signal whenever the read operation is performed;
   a latch part configured to latch the received bank select signal; and
   a control part configured to enable an operation of the first enable part or the second enable part in response to the bank select signal in the read operation of the parallel test.

14. The semiconductor memory device as recited in claim 11, wherein the bank select signal is a bank address.

15. The semiconductor memory device as recited in claim 11, wherein the first enable part and the second enable part are configured to enable the column operation of the memory banks according to a combination of bank addresses in a normal operation mode that is not the parallel test.

16. The parallel test method as recited in claim 1, wherein the number of memory banks being simultaneously written is greater than the number of memory banks being simultaneously read.

17. The parallel test method as recited in claim 4, wherein the number of memory banks being simultaneously written is greater than the number of memory banks being simultaneously read.

18. The semiconductor memory device as recited in claim 9, wherein the number of memory banks being simultaneously enabled when the write command is received is greater than the number of memory banks being simultaneously enabled when the read command is received.

* * * * *